United States Patent [19]
Wei

[11] Patent Number: 5,659,197
[45] Date of Patent: Aug. 19, 1997

[54] HOT-CARRIER SHIELD FORMATION FOR BIPOLAR TRANSISTOR

[75] Inventor: Yi-Hen Wei, Saratoga, Calif.

[73] Assignee: VLSI Technology, Inc.

[21] Appl. No.: 311,092

[22] Filed: Sep. 23, 1994

[51] Int. Cl.$^6$ ............................................. H01L 29/72
[52] U.S. Cl. ...................... 257/588; 257/589; 257/590; 257/592; 257/593
[58] Field of Search ............................ 257/588, 589, 257/590, 591, 592, 593, 344

[56] References Cited

U.S. PATENT DOCUMENTS

| | | | |
|---|---|---|---|
| 4,839,305 | 6/1989 | Brighton | 257/588 |
| 5,198,692 | 3/1993 | Momose | 257/591 |
| 5,342,794 | 8/1994 | Wei | 257/591 |

OTHER PUBLICATIONS

H. Honda et al., "Supression of Hot Carrier Effects by Laterally Graded Emitter (LGE) Structure in BiCMOS", IEDM Technical Digest, 1990, pp. 227–230.

Primary Examiner—Mark V. Prenty
Attorney, Agent, or Firm—Clifton L. Anderson

[57] ABSTRACT

The present invention provides a bipolar transistor in which a lightly doped n-type hot-carrier shield extends in an epitaxial layer adjacent from a poly-emitter to an extrinsic base. This hot-carrier shield minimizes performance impairment that would otherwise occur due to a hot-carrier effect. Key steps in the method of making the bipolar transistor include a differential thermal oxidation while the poly-emitter is covered with a nitride cap. After the nitride cap is removed, an n-type dopant is implanted. The unprotected poly emitter is heavily doped. The implant partially penetrates a relatively thin oxide growth, thereby forming the hot-carrier shield. Other areas, such as the extrinsic base, and a polycrystalline base extension are covered by a relatively thick oxide growth and are unaffected by the n-type implant.

5 Claims, 4 Drawing Sheets

HOT-CARRIER SHIELD FORMATION FOR BIPOLAR TRANSISTOR

This application is a substitute for Ser. No. 07/943,072 filed Sep. 10, 1992 and now abandoned.

BACKGROUND OF THE INVENTION

The present invention relates to integrated circuits and, more particularly, to fabrication of a bipolar transistor. A major objective of the present invention is to provide a high-performance bipolar transistor in which a "hot-carrier effect" is minimized.

Much of modern technological progress is associated with advances in semiconductor processing technology that have provided greater speed and integration in electrical circuits. The basic building blocks of these circuits are transistors, which typically serve as electric switches, detectors and amplifiers. Of several alternative transistor processing technologies, of primary interest herein is BiCMOS, which integrates bipolar and CMOS technology. In a BiCMOS device, bipolar transistors typically use oxide isolation over a base region; the oxide isolation subjects the transistors to a hot-carrier effect that impairs the performance. The hot-carrier effect also impairs non-BiCMOS bipolar transistors using oxide isolation. However, some non-BiCMOS technologies use junction isolation and do not suffer from this effect.

A bipolar transistor comprises a p-type base sandwiched between an n-type emitter and an n-type collector. Under a forward bias, the collector is at a higher potential than the emitter. No electron current flows from the emitter to the collector unless there is a base current. A small base current induces an electron avalanche to flow from the emitter to the collector. The ratio of the emitter current $I_e$ to the base current $I_b$ is referred to as the transistor gain $\beta$, an important performance parameter for a bipolar transistor.

A typical bipolar transistor includes a subcollector in the form of a heavily doped n-type region in a p-type silicon substrate. The subcollector is buried by a p-type epitaxial silicon layer. The region of the epitaxial silicon layer above the subcollector is moderately doped n-type to define a collector drift region. An upper sublayer of the collector drift region is doped p-type to define an intrinsic base. An epi-emitter can be formed by heavily implanting a localized region of the intrinsic base with n-type dopant. Higher performance can be attained using an alternative poly-emitter: polysilicon is deposited over the epitaxial layer; the polysilicon is patterned to define a polysilicon emitter structure; the polysilicon emitter structure is heavily doped n-type; and the implant is driven through the polysilicon emitter structure into the epitaxial layer below so that the poly-emitter includes a polysilicon emitter section and a very shallow epitaxial emitter section.

Access to the intrinsic base is provided by an extrinsic base, located laterally of the emitter. The extrinsic base is heavily doped p-type and is spaced from the emitter to prevent a short between two heavily doped regions of opposite conductivity types. Access to the subcollector is provided by a heavily doped n-type collector sink, also laterally spaced from the emitter. A link-base section of the intrinsic base between the emitter and the extrinsic base can be more heavily doped than a center-base section of the intrinsic base below the emitter. When the link-base section of the intrinsic base is more heavily doped, it is commonly referred to as a "link base". The heavier doping reduces base resistance and consequently increases transistor gain $\beta$.

To achieve a forward bias, a positive potential is applied to the subcollector through the collector sink and a negative potential is applied to the emitter. A base current is introduced to the intrinsic base through the extrinsic base. The base current induces an emitter current of electrons flowing generally toward the collector. Some of the emitter electrons combine with holes in the base and never reach the collector. These recombinations impair performance.

Recombinations are more likely when electrons travel through more heavily doped p-type regions and wheless likely when electrons travel shorter distances through a lightly doped base. These conditions are attained by electrons that travel straight down from the emitter through the center base region to the collector drift region.

Not all electrons travel straight down. Some electrons exit the emitter laterally and travel a circuitous path through the link-base section to the collector. The longer path through the link-base section results in more recombinations and lower gain, especially in cases where the link-base section is more heavily doped than the center-base section. The hot-carrier effect causes a higher percentage of electrons to exit the emitter laterally into this link-base section. Thus, more recombinations occur and performance is degraded.

The hot-carrier effect is established while a bipolar transistor is reversed biased. Reverse biasing can occur temporarily during a transistor transition in which the base potential falls more rapidly than the emitter potential. Under reverse bias, the emitter is at a higher potential than the base. Electrons are drawn from the extrinsic base through the link-base section and toward the emitter. The electric field is the strongest at the junction between the emitter and the intrinsic base. At this boundary, electrons endure the greatest acceleration. Scattering can direct some of the electrons toward the oxide above the link-base section. Normally, a potential barrier at the junction between the oxide and the link-base section is sufficient to prevent entry of electrons into the oxide. However, when the reverse-bias field is strong enough, these electrons can have enough energy to jump the potential barrier and travel into the oxide. Having lost some energy in the process, the electrons are trapped in the oxide. In the process of jumping the potential barrier, the electrons introduce defects in the junction, lowering the barrier and making it easier for more electrons to be trapped in the oxide.

The trapped electrons establish an electric field that attracts positive charges that accumulate in the epitaxial layer near the oxide. When a forward bias is applied to the transistor, electrons exiting the emitter can be attracted by the gathered positive charges. Thus more electrons exit laterally from the emitter and those that travel laterally spend more time near the upper potions of the link-base section, near the oxide. Here they can cross the impaired oxide barrier and be trapped or they can recombine with the accumulated positive charges. Collectively, these effects decrease the percentage of electrons reaching the collector. As a result, transistor gain $\beta$ is diminished.

A laterally graded emitter can be used to reduce the hot-carrier effect as disclosed by Honda et al. in "Suppression of Hot Carrier Effects by Laterally Graded Emitter (LGE) Structure in BiCMOS", *IEDM Technical Digest*, 1990, pp. 227–230. In the LGE approach, a lightly doped n-type region extends from a heavily doped n-type epi-emitter into a lightly doped p-type link-base section of an intrinsic base between the epi-emitter and the extrinsic base. The p/n junction is thus between two lightly doped regions, resulting in a smaller peak field strength. Thus, electrons undergo less acceleration and are less likely to be injected into the oxide. Thus, the hot-carrier effect is reduced and performance impairment is diminished.

Formation of the disclosed laterally graded emitter is as follows. An emitter opening is defined in a silicon dioxide mask. A light n-type implant is made. An oxide sidewall is then grown on the mask. Then a heavy n-type implant is made. The result is a heavily doped n-type epi-emitter inside a lightly doped n-type lateral emitter.

While the LGE approach does reduce the hot-carrier effect, further reductions are desired. In addition to its limited effectiveness, the LGE approach suffers from incompatibility with two recognized performance enhancements for bipolar transistors. First, as indicated above, a link-base section more heavily doped than the center-base section can reduce base resistance and improve the transistor gain β. However, increasing link-base doping increases the field at the LGE p/n junction, increasing the hot-carrier effect. Hence the LGE approach imposes a conflict between decreased base resistance and decreased hot-carrier effect.

Second, the LGE method for fabricating a bipolar transistor is not compatible with the poly-emitter approach. There is no suggestion as to how one would position a polysilicon emitter structure with appropriate precision between the light emitter implant and the subsequent heavy emitter implant.

Third, the LGE method is prone to defective junctions between the emitter and the intrinsic base. Since a light implant precedes a heavy implant, there is a likelihood that the light implant will be driven deeper than the heavy implant. The result is an emitter that is not only laterally graded, but also vertically graded. The vertically graded emitter would result in a less effective injection of electrons into and through the intrinsic base, impairing performance.

What is needed is a bipolar transistor and a method for making the bipolar transistor that minimizes the hot-carrier effect, while providing compatibility with BiCMOS processing, including the fabrication of established performance features. In particular, poly-emitters and link-bases should be employable without compromising the effectiveness of hot-carrier effect reduction. Finally, the transistor and method should avoid the problem of a vertically graded emitter and provide a relatively sharp junction between the base and emitter.

SUMMARY OF THE INVENTION

The present invention provides a bipolar transistor with a hot-carrier shield that extends along an isolation oxide from a poly-emitter to an extrinsic base. An advantage of the present invention is that the lateral p/n junction adjacent the field oxide is at the extrinsic base; any fields due to electrons injected into the field oxide are as far away as possible from the emitter/collector current. This minimizes any impairment by hot-carrier effect fields on transistor gain.

Processing can begin conventionally through the formation of a base implant. A polysilicon deposition is introduced over the base implant. The polysilicon is etched to define a polysilicon emitter structure and a polysilicon base extension structure. The polysilicon emitter structure and the adjacent link-base section are masked with photoresist; the polysilicon base extension structure and an adjacent extrinsic-base region are exposed.

An extrinsic base implant is then performed, heavily doping the extrinsic base region of an epitaxial silicon layer, the polysilicon base extension structure, and an epitaxial base extension region beneath the polysilicon base extension structure. This doping defines an extrinsic base, a polysilicon base extension and an epitaxial base extension. The photoresist is then removed from the polysilicon emitter structure and the link-base section.

A low-temperature thermal oxidation is then performed, forming the isolation oxide. The oxide grows faster on heavily doped regions, e.g., the extrinsic base and the polysilicon base extension. The isolation oxide grows more slowly over the relatively lightly doped link-base section that was covered by photoresist during the extrinsic base implant; likewise, a thin oxide grows on the sidewall of the polysilicon emitter structure. As a result, the averge thickness of the "extrinsic-base" isolation oxide section over the extrinsic base is at least twice the average thickness of the "shield" isolation oxide section over the link-base section.

After the isolation oxide is grown, an emitter implant is performed. This emitter implant heavily dopes the polysilicon emitter structure. A subsequent drive-in causes the implanted dopant to diffuse through the polysilicon emitter structure and into the epitaxial layer below, establishing a poly-emitter. During the emitter implant, a relatively small amount of dopant penetrates the relatively thin shield isolation oxide section, establishing an emitter shield that is lightly doped n-type. The relatively thick extrinsic-base isolation oxide section prevents emitter dopant from entering the extrinsic base and the polysilicon base extension.

Since it is to be more heavily doped than the hot-carrier shield, the polysilicon emitter structure should not be covered with oxide during the emitter implant. To this end, a nitride deposition can follow the polysilicon deposition and be patterned identically. After the polysilicon emitter structure is masked, nitride can be etched from the polysilicon base extension structure, which thus is exposed during the extrinsic base implant. A nitride cap remains on the polysilicon emitter structure during thermal oxidation, so that no oxide grows on the top. The nitride cap is removed after the thermal oxidation to expose the polysilicon emitter structure in preparation for the emitter implant.

The present invention minimizes the hot-carrier effect by positioning the 3-way p/n/o boundary of the p-type/n-type and oxide at the extrinsic base. As a result, the peak electric field induced by a reverse bias is as far removed from the emitter as possible. Therefore, fields established by the hot-carrier effect are sufficiently far from the emitter electron paths as to affect them only negligibly. A further advantage of the present invention is that both lateral extremes of the hot-carrier shield are self aligned, i.e., the shield is inherently aligned with both the poly-emitter and the extrinsic base; greater precision is achieved since mask registration errors are not introduced. These gains are achieved without sacrificing compatibility with BiCMOS processing.

When compared to the LGE approach, the present invention takes advantage of the fact that the location of the peak reverse bias field is at least as important as its magnitude. While the LGE approach can achieve a lower peak, that peak would be closer to the emitter, for example, by a factor of four using one micron technology.

Further advantages of the present invention over the LGE approach include compatibility with recognized performance-enhancing features. The method of the present invention inherently results in a poly-emitter. A link base can be implemented by implanting link-base dopant after etching the polysilicon and before masking the polysilicon emitter. Implementing the link base does not significantly affect the hot-carrier effect reduction since the link-base section is separated from the isolation oxide by the hot-carrier shield. The method of the present invention provides for both a heavily doped emitter and a more lightly doped emitter shield using a single implant. Thus, the present invention avoids the LGE problem of a vertically graded emitter. These and other features and advantages of the present invention are apparent from the description below with reference to the following drawings.

Figure 1:
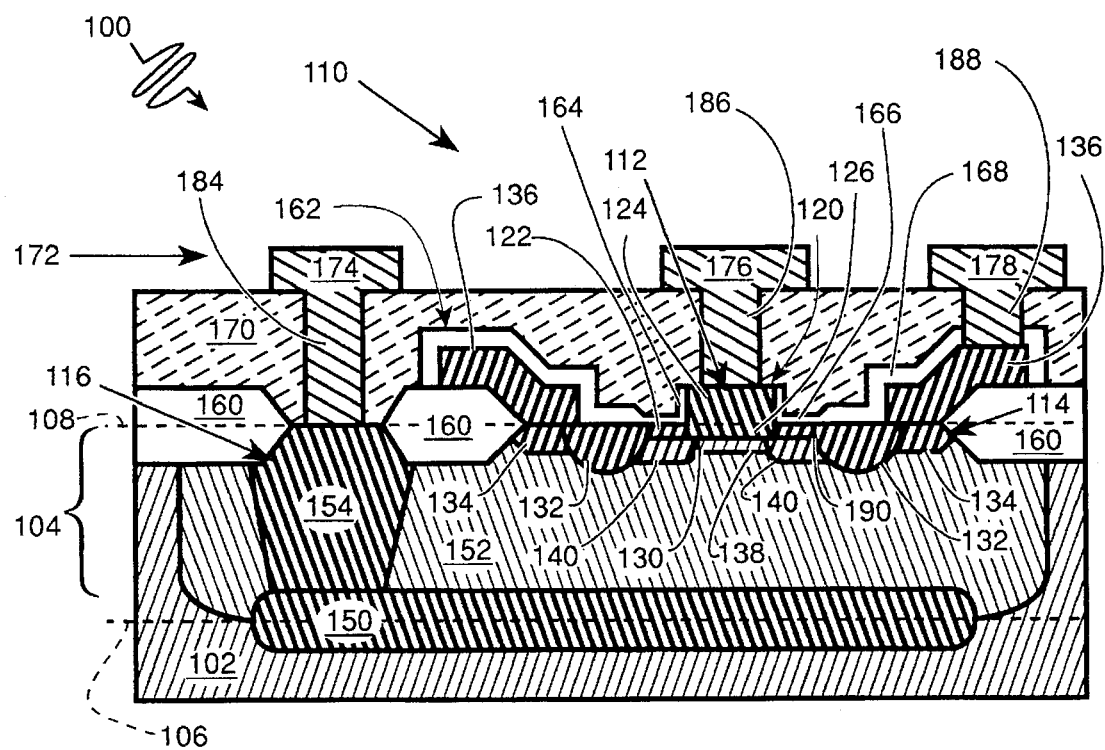
FIG. 1 is an elevational view of a bipolar transistor in accordance with the present invention.

In the drawings, positively doped silicon is shown with hatching having a steep (70°) slope, and negatively doped silicon is shown with hatching having a steeply negative (–70°) slope. In doped silicon, the width of the hatch lines roughly indicates doping density. Undoped polysilicon is vertically hatched. Metal is shown with having a gentle negative (–30°) slope. Silicon dioxide (oxide) is shown in white. Organic glass is shown with a gentle dashed positive (30°) slope. Photoresist is shown with alternating solid and dashed hatching.

DESCRIPTION OF THE PREFERRED EMBODIMENTS

An integrated circuit wafer 100 has a substrate 102 and an epitaxial layer 104 formed over substrate 102, as shown in FIG. 1. Epitaxial layer 104 has an epitaxial bottom surface 106 and an epitaxial top surface 108. Fabricated in wafer 100 is a bipolar transistor 110 having an emitter assembly 112, a base assembly 114, and a collector assembly 116.

In accordance with the present invention, emitter assembly 112 includes a poly-emitter 120 and a hot-carrier shield 122. Poly-emitter 120 encompasses a polysilicon emitter section 124 and a epitaxial emitter section 126. Epitaxial emitter section 126 is directly below polysilicon emitter section 124. Hot-carrier shield 122 extends laterally from epitaxial emitter section 124. Poly-emitter 120 is heavily doped n+, while hot-carrier shield 122 is relatively lightly doped n–.

Base assembly 114 includes an intrinsic base 130, an extrinsic base 132, an epitaxial base extension 134, and a polysilicon base extension 136. Intrinsic base 130 includes a center-base section 138 and a link-base section 140. Center-base section 138 is directly below epitaxial emitter section 126. Link-base section 140 extends laterally from center-base section 138 to extrinsic base 132. Link-base section 140 is separated from epitaxial top surface 108 by hot-carrier shield 122. Extrinsic base 132 is defined within epitaxial layer 104, extending downwardly from epitaxial top surface 108; epitaxial base extension 134 is formed similarly in epitaxial layer 104 and secures electrical coupling of polysilicon base extension 136 and extrinsic base 132. Polysilicon base extension 136 contacts polysilicon base extension 134 at epitaxial top surface 108, and extends upward and laterally outward therefrom to provide electrical access to base assembly 114.

Extrinsic base 132, epitaxial base extension 134, and polysilicon base extension 136 are heavily doped p+ for maximal conductivity. To prevent high fields and shorting, these p+ elements are laterally spaced from n+ poly-emitter 120, which primarily contacts lightly doped p– center-base section 138. While also designated p– herein, link-base section 140 is more heavily doped than center base section 138 to decrease base resistance between extrinsic base 136 and center-base section 138.

Collector assembly 116 includes a subcollector 150, a collector drift region 152, and a collector sink 154. Subcollector 150 lies at least partially within substrate 102, and is "buried" by epitaxial layer 104, giving rise to an alternate appellation of "buried layer" for subcollector 150. Collector sink 154 extends from epitaxial top surface 108 down to subcollector 150 to provide electrical access thereto. Subcollector 150 and collector sink 154 are heavily doped n+ to maximize conductivity. Accordingly, these elements are spaced vertically and laterally, respectively, from base assembly 114 by lightly doped n– collector drift region 152 of epitaxial layer 104.

Electrical isolation is provided at the epitaxial top surface 108 by a field oxide 160 and by an isolation oxide 162. Field oxide 160 isolates transistors from each other and isolates collector sink 154 from intrinsic base 130.

Isolation oxide 162 includes a relatively thin emitter-sidewall oxide section 164, a relatively thin shield oxide section 166, and a relatively thick extrinsic-base oxide section 168. Shield oxide section 166 extends along epitaxial top surface 108, and is generally coextensive with and in contact with hot-carrier shield 122. Emitter-sidewall oxide section 164 and shield oxide section 166 are between 200 angstroms (Å) and 500 Å thick, while extrinsic base oxide section 168 is 1000 Å to 2500 Å thick. The preferred values are about 300 Å for the thinner oxide sections and about 1500 Å for extrinsic base oxide section 168. Shield oxide section 166 is one feature size from poly-emitter to extrinsic base 132; since transistor 110 is fabricated using one-micron technology, that distance is one micron.

An organic glass layer 170 provides further electrical isolation and serves as a planar surface for an interconnect pattern 172, including conductors 174, 176, and 178, which are respectively electrically coupled to collector sink 154, polysilicon emitter section 124, and polysilicon base extension 136, by respective vias 184, 186 and 188.

When bipolar transistor 110 is on, a small base current is associated with a large emitter current. The base electron current comprises a positive-charge (electron hole) current from conductor 178, through via 188, through polysilicon base extension 136, through epitaxial base extension 134, through extrinsic base 132, through link-base section 140, into center-base section 138. The presence of positive charges in center-base section 138 encourages the injection of electrons therein from poly-emitter 120. The emitter electron current flows from conductor 176, through via 186, through poly-emitter 120, whence it is injected into base center section 138. Some of the electrons recombine with positive charge of the base current. Most injected electrons are drift into collector drift region 152 under the influence of the collector field. These electrons travel through collector drift region 152, through subcollector 150, up through collector sink 154, through via 184, to conductor 174.

A high gain β for transistor 110 is achieved by maximizing the number of emitter electrons that travel essentially straight down through center base section 138. Statistically, some electrons exit epitaxial emitter section 126 more or less laterally, and travel longer distances through intrinsic base 130. The chances of recombination are increased due to the heavier doping of link-base section 140. However, lateral travel is minimized by the operation of hot-carrier shield 122.

In the absence of hot-carrier shield 122, performance could be degraded by the hot-carrier effect. In certain circuit configurations, a sharp transition of a shieldless transistor causes a temporary reverse bias so that its epitaxial emitter is at a higher potential than its extrinsic base. Electrons accelerate from its extrinsic base toward its epitaxial emitter. When the fields set up by the reverse bias are sufficiently strong, some electrons are injected into its isolation oxide. These electrons cause positive charges to accumulate within its link-base section. These charges establish an electric field that attracts electrons laterally from epitaxial emitter. The lateral attraction causes emitter electrons to travel longer paths through more heavily doped base regions. Performance of the shieldless transistor is thus degraded.

The LGE approach reduces the peak strength of the reverse bias field by replacing a n+/p− emitter/base junction with a n−/p− junction. However, this approach discourages the use of a link base that would yield a greater peak field strength due to the heavier p-type doping.

The present invention improves over the LGE approach by recognizing that the distance of the peak field from an emitter is at least as important as the magnitude of the peak. Hot-carrier shield 122 moves the three-way emitter/base/oxide boundary 190'' all the way to the extrinsic base. Any trapped electrons and positive charge field will accumulate at the three-way p/n/o boundary 190. The fields created at boundary 190 negligibly impact emitter electrons. In addition, the present invention is not adversely affected by a more heavily doped link-base section, so the performance advantages of a link base can be realized. Furthermore, while the LGE approach did not provide for a poly-emitter, the method of the present invention does provide for a poly-emitter and its concomitant performance advantages, as described below.

Figure 2:
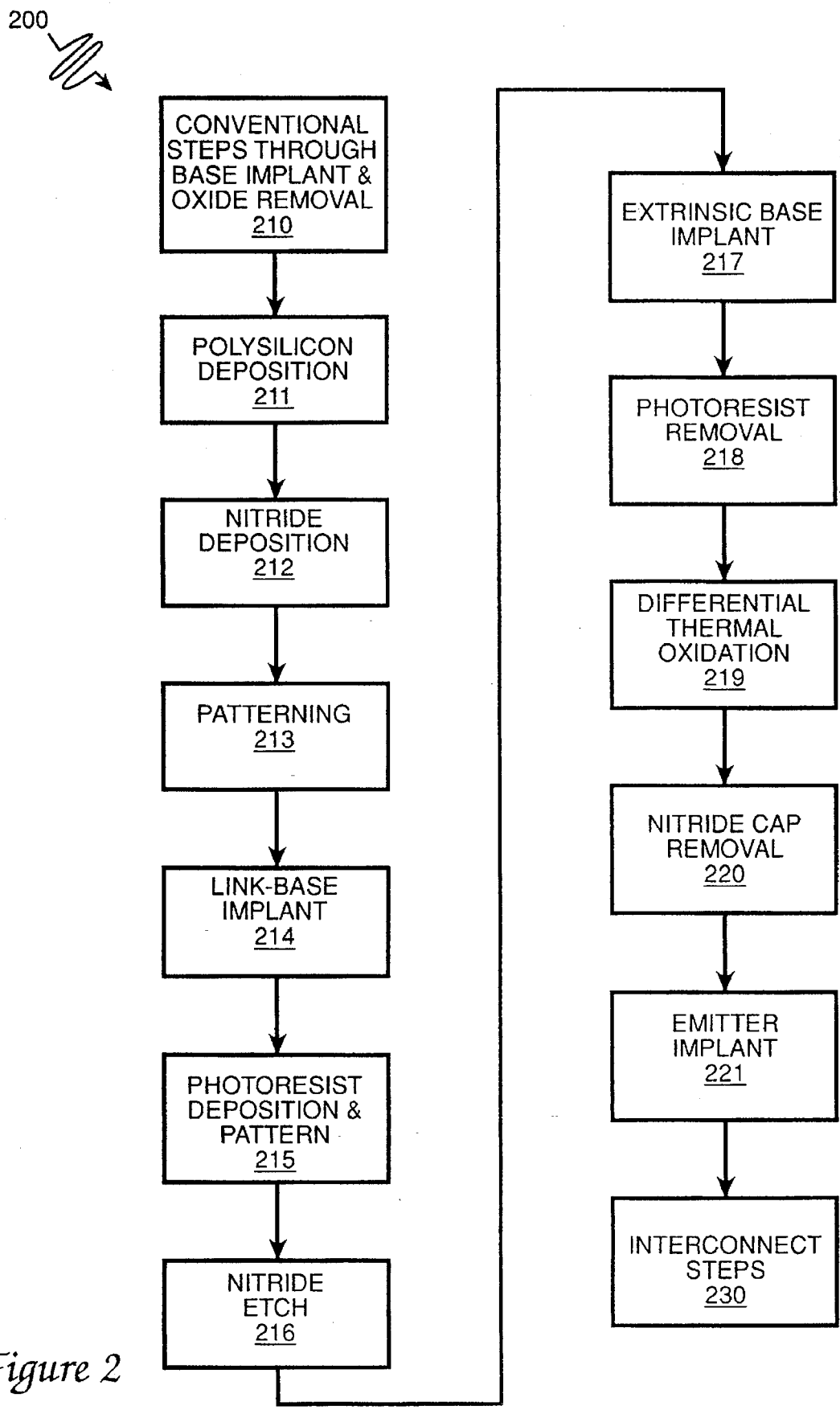
FIG. 2 is a flow chart of a method of fabricating the transistor of FIG. 1 in accordance with the present invention.

Transistor 100 is fabricated in accordance with a BiCMOS method 200, flow charted in FIG. 2. Method 200 begins with a conventional series of steps 210 through a base implant and a gate oxide removal. The conventional steps start with the preparation of p-type substrate 102. After appropriate masking, an n++ implant is made to provide the doping that will define subcollector 150. A p− epitaxial growth provides epitaxial layer 104 and buries the subcollector implant. During the thermally elevated step of forming the epitaxial layer, the subcollector implant diffuses into substrate 102 and epitaxial layer 104 to form subcollector 150.

Twin-well formation provides regions of n− type and p− wells in epitaxial layer 104. The p-wells serve as sites for NMOS transistors. The n-wells serve as sites for PMOS transistors and provide for collector drift regions for bipolar transistors; accordingly collector drift region 152 of bipolar transistor is established during twin-well formation.

Figure 3A:
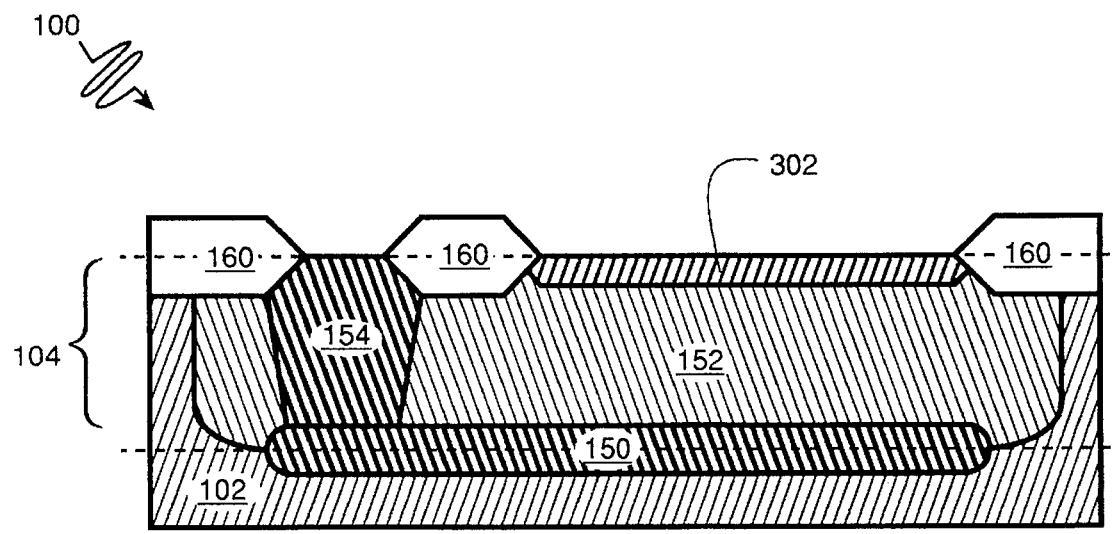
FIGS. 3A–3D are elevational views of the transistor of FIG. 1 during steps of the method of FIG. 2.

A field oxide pattern is masked, and epitaxial layer 104 is etched through the pattern to provide sites for field oxide 160, which is then grown thermally. Formation of collector sink 154 then proceeds by forming a sink mask, implanting n-type dopant, and driving in the dopant. As method 200 is a BiCMOS process, a gate oxide layer is grown to provide for gate oxides isolating MOSFET gates from respective channel regions. The gate oxide also aids in the fabrication of bipolar transistors since it protects epitaxial layer 104 from damage during a moderate boron difluoride implant. After suitable drive-in, the resulting base implant 302 takes the form shown in FIG. 3A. After the implant, the gate oxide is selectively etched. Gate oxide 302 is left in place over MOS transistors, but is removed from over bipolar transistors. FIG. 3A illustrates the structure resulting through the base implant and gate-oxide etch, and thus the completion of conventional series of steps 210.

A polysilicon layer is deposited at step 211, followed by a deposition of a silicon nitride layer step 212. The polysilicon layer and the nitride layer are photolithographically patterned at step 213. This patterning defines a polysilicon emitter structure 304 and a polysilicon base extension structure 306 for bipolar transistor 100, shown in FIG. 3B. Polysilicon emitter structure 304 has a nitride cap 308, while polysilicon base extension structure 306 is also covered with a nitride formation 310. In addition, the patterning defines gates, source contacts and drain contacts for MOSFETs.

Figure 3B:
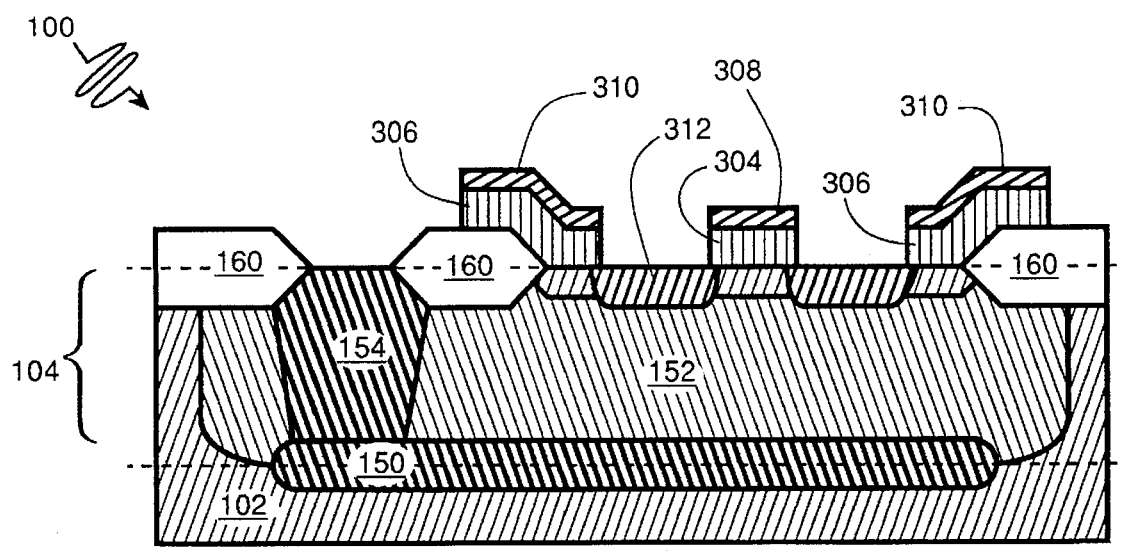

At step 214, a boron difluoride link-base implant increases the p-type concentration of a link-base implant region 312 of epitaxial layer 104. Link-base implant region 312 corresponds to the region of intrinsic base implant 302 (FIG. 3A) less regions below polysilicon emitter structure 304 and polysilicon base extension structure 306. The link-base implant is designed to increase the p-type conductivity and thus decrease the resistance of link-base section 140. FIG. 3B illustrates bipolar transistor 100 after the link base implant of step 214.

Figure 3C:
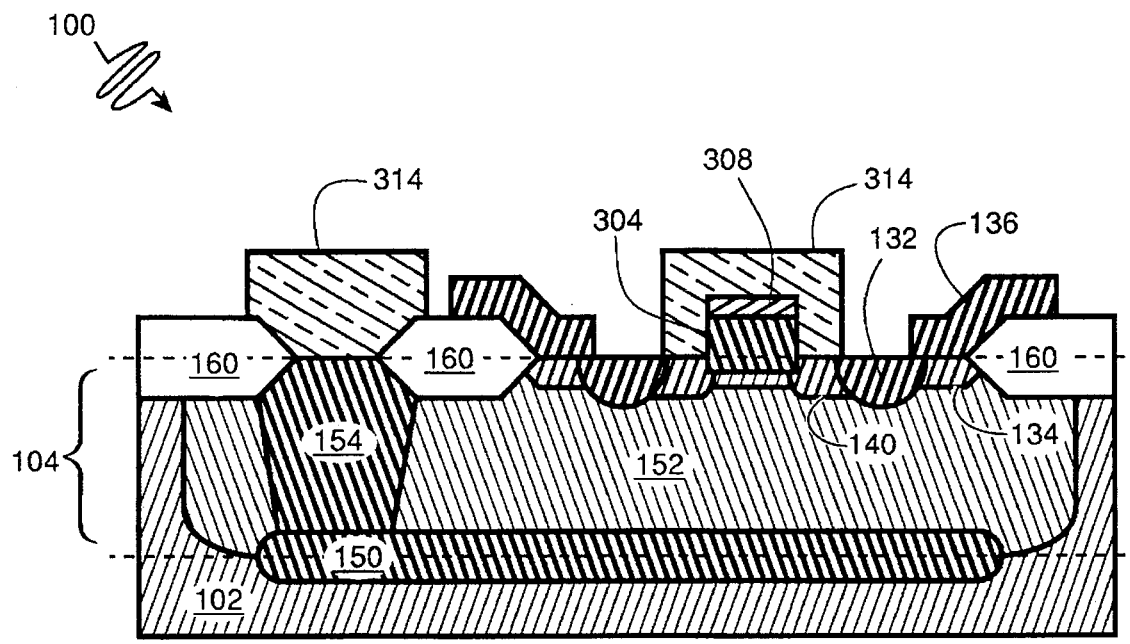

Photoresist is deposited over the structure of FIG. 3B and patterned, at step 215. The patterned photoresist 314 covers polysilicon emitter structure 304, nitride cap 308 and collector sink 154, as indicated in FIG. 3C. Nitride 310 is then etched from unprotected areas of polysilicon at step 216. This exposes the polysilicon of polisilicon base extension structure 306, but leaves nitride cap 308 over polysilicon emitter structure 304.

At step 217, a heavy boron implant provides the doping for extrinsic base 132. This implant also heavily dopes polysilicon base extension structure 306. In addition, the implant forms the sources and drains for PMOS transistors. The formation of extrinsic base 132 defines a boundary of link-base section 140. The diffusion of p-type dopant through polysilicon base-extension structure 306 into epitaxial layer 104 defines epitaxial base extension 136 to form isolation oxide 162. FIG. 3C shows bipolar transistor 100 after the extrinsic base implant of step 217.

Figure 3D:
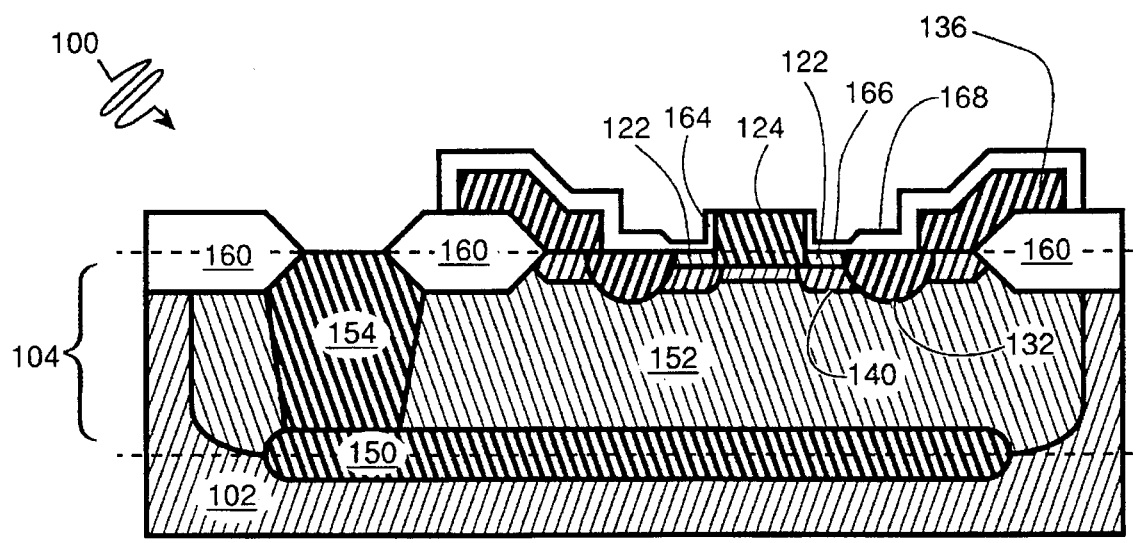

After photoresist is removed, at step 218, a low temperature differential thermal oxidation is performed at step 219. Oxide grows faster over heavily doped areas than over lightly doped areas. Accordingly, relatively thick extrinsic-base oxide section 168 forms over heavily doped extrinsic base 132 and polysilicon base extension 136, as shown in FIG. 3D. Relatively thin shield oxide section 166 forms over more-lightly-doped link-base section 140. Likewise, thin emitter sidewall oxide section 164 grows on the sides of polysilicon emitter section 124. No oxide grows over nitride cap 308. After the thermal oxidation, a nitride etch removes nitride cap 308 at step 220, exposing polysilicon at the top of polysilicon emitter section 124.

N-type dopant is implanted in heavy concentration and driven in at step 221, the results of which are illustrated in FIG. 3D. This implant is heaviest into uncapped polysilicon emitter section 124. A lesser, but still significant amount of dopant penetrates shield oxide section 166, defining hot-carrier shield 122. Negligible dopant penetrates the relatively thick extrinsic base oxide section 168 over extrinsic base 132 and polysilicon base extension 136. During drive-in, dopant diffuses through polysilicon emitter structure 304 and into epitaxial layer 104 to establish epitaxial emitter section 126. In addition, this emitter implant provides dopant for the sources and drains for NMOS transistors.

Conventional series of steps 230 provides for transistor interconnect. Organic glass layer 170 is deposited over the structure of FIG. 3D, as indicated in FIG. 1. This organic glass layer serves as a dielectric and provides a planar surface on which to form interconnects. Apertures are formed in organic glass layer 170 to provide access to collector sink 154, poly-emitter 120, polysilicon base extension 136, and contacts for MOS devices. Aluminum is deposited over organic glass layer 170, filling the apertures to define metal vias 184, 186, and 188. The aluminum is patterned to define conductors 174, 176, and 178 that provide interconnection with other devices on wafer 100. FIG. 1 shows bipolar transistor 100 after aluminum patterning. Additional layers of dielectric and metal can be added for additional levels of interconnect.

The present invention provides for variations on the above-described structure and method. For example, the link-base implant step 214 can be omitted so that the link-base sectio of the resulting transistor has the same doping as the intrinsic base.

Method 200 employs a nitride cap to prevent oxide growth over the polysilicon emitter section, while a thin oxide was grown over the eventual location of the hot-carrier shield. The present invention provides alternative methods for preventing the growth of oxide over the poly-emitter cap. Alternatively, the oxide can be grown and then selectively removed from over the emitter. If desired, the conductivity types of the illustrated embodiment can be reversed to provide an PNP bipolar transistor. These and other modifications to and variations upon the preferred embodiments are provided for by the present invention, the scope of which is limited only by the following claims.

I claim:

1. A bipolar transistor comprising:

a silicon substrate (102);

an epitaxial layer (104) of silicon formed over said substrate, said epitaxial layer having an epitaxial bottom surface (106) and an epitaxial top surface (108), said epitaxial bottom surface being in contact with said substrate;

a subcollector (150) defined at least partially within said substrate, said subcollector being buried by said epitaxial layer, said subcollector having a first conductivity type;

a collector drift region (152) defined within said epitaxial layer, said collector drift region contacting said subcollector, said collector drift region having said first conductivity type and being less heavily doped than said subcollector a poly-emitter (120), said poly-emitter including a polysilicon emitter section (124) formed on said epitaxial top surface, said polysilicon emitter section having said first conductivity type, and an epitaxial emitter section (124) defined within said epitaxial layer and directly below said polysilicon emitter section, said epitaxial emitter section having said first conductivity type;

an extrinsic base (132) defined within said epitaxial layer, said extrinsic base extending downward from said epitaxial top surface, said extrinsic base being laterally spaced from said epitaxial emitter section, said extrinsic base having a second conductivity type opposite to said first conductivity type;

an oxide formation (162) extending along said epitaxial top surface, said oxide formation including a shield oxide section (166) extending from said poly-emitter to said extrinsic base, and a base oxide section (168) extending at least partially over and in contact with said extrinsic base;

an intrinsic base (130) defined within said epitaxial layer, said intrinsic base having said second conductivity type, said intrinsic base extending between said epitaxial emitter section and said collector drift region, said intrinsic base being doped less heavily doped than said extrinsic base, said intrinsic base including a center-base section (138) directly below said epitaxial emitter section, and a link-base section (140) between said center-base section and said extrinsic base; and a hot-carrier shield (122) defined within said epitaxial layer, said hot-carrier shield extending from said epitaxial emitter section to said extrinsic base, said hot-carrier shield being in contact with said shield oxide section and said link-base section, said hot-carrier shield having said first conductivity type and being less heavily doped than said epitaxial emitter section.

2. A bipolar transistor as recited in claim 1 wherein said base oxide section (168) is thicker than said shield oxide section.

3. A bipolar transistor as recited in claim 1 wherein the average thickness of said base oxide section is at least twice the average thickness of said shield oxide section.

4. A bipolar transistor as recited in claim 1 wherein said link-base section is more heavily doped than said center-base section so as to define a link base.

5. A bipolar transistor as recited in claim 1 further comprising a polysilicon base extension (136) in contact with said extrinsic base and at least partially covered by said base oxide section, said polysilicon base extension having said second conductivity type.

* * * * *